United States Patent
Hu et al.

(10) Patent No.: US 8,642,475 B2
(45) Date of Patent: Feb. 4, 2014

(54) INTEGRATED CIRCUIT SYSTEM WITH REDUCED POLYSILICON RESIDUE AND METHOD OF MANUFACTURE THEREOF

(75) Inventors: Xiang Hu, Beacon, NY (US); Helen Wang, LaGrangeville, NY (US); Arifuzzaman (Arif) Sheikh, Poughkeepsie, NY (US); Habib Hichri, Poughkeepsie, NY (US); Richard Wise, Newburgh, NY (US)

(73) Assignees: GLOBALFOUNDRIES Singapore Pte. Ltd., Singapore (SG); International Business Machines Corporation, Armonk, NY (US)

( * ) Notice: Subject to any disclaimer, the term of this patent is extended or adjusted under 35 U.S.C. 154(b) by 161 days.

(21) Appl. No.: 12/975,327

(22) Filed: Dec. 21, 2010

(65) Prior Publication Data

US 2012/0153474 A1    Jun. 21, 2012

(51) Int. Cl.
*H01L 21/311*    (2006.01)

(52) U.S. Cl.
USPC .......................................................... 438/700

(58) Field of Classification Search
USPC ................................................. 438/700, 717
See application file for complete search history.

(56) References Cited

U.S. PATENT DOCUMENTS

| | | |
|---|---|---|
| 5,837,596 A | 11/1998 | Figura et al. |
| 5,911,835 A | 6/1999 | Lee et al. |
| 6,010,829 A * | 1/2000 | Rogers et al. ................ 430/316 |
| 6,033,996 A | 3/2000 | Rath et al. |
| 6,039,888 A | 3/2000 | Ha et al. |
| 6,150,282 A | 11/2000 | Rath et al. |
| 6,200,902 B1 * | 3/2001 | Mitsuiki ....................... 438/700 |
| 6,380,096 B2 | 4/2002 | Hung et al. |
| 6,541,164 B1 | 4/2003 | Kumar et al. |
| 6,607,985 B1 | 8/2003 | Kraft et al. |
| 6,613,681 B1 | 9/2003 | Hillyer et al. |
| 6,703,319 B1 | 3/2004 | Yates et al. |
| 6,727,501 B1 | 4/2004 | Fan et al. |
| 6,770,214 B2 | 8/2004 | Outka et al. |
| 6,790,733 B1 | 9/2004 | Natzle et al. |
| 6,933,239 B2 | 8/2005 | Ying et al. |
| 6,960,533 B2 | 11/2005 | Nakaune et al. |
| 6,995,093 B2 | 2/2006 | Suzuki |
| 7,001,848 B1 | 2/2006 | Smith et al. |
| 2006/0003910 A1 | 1/2006 | Hsu et al. |
| 2006/0254617 A1 | 11/2006 | Itou |
| 2007/0077353 A1 | 4/2007 | Lee et al. |
| 2008/0293249 A1 | 11/2008 | Cho et al. |
| 2009/0191711 A1 | 7/2009 | Rui et al. |
| 2010/0040982 A1 | 2/2010 | Liu et al. |

* cited by examiner

*Primary Examiner* — Jenny L Wagner
(74) *Attorney, Agent, or Firm* — Ishimaru & Associates LLP

(57) ABSTRACT

A method of manufacturing an integrated circuit system includes: providing a substrate; forming a polysilicon layer over the substrate; forming an anti-reflective coating layer over the polysilicon layer; etching an anti-reflective coating pattern into the anti-reflective coating layer leaving an anti-reflective coating residue over the polysilicon layer; and etching the anti-reflective coating residue with an etchant gas mixture comprising hydrogen bromide, chlorine, and oxygen to remove the anti-reflective coating residue for mitigating the formation of a polysilicon protrusion.

20 Claims, 5 Drawing Sheets

INTEGRATED CIRCUIT SYSTEM WITH REDUCED POLYSILICON RESIDUE AND METHOD OF MANUFACTURE THEREOF

TECHNICAL FIELD

The present invention relates to the field of integrated circuits and more specifically to integrated circuit system with reduced polysilicon residue.

BACKGROUND ART

Modern electronics, such as smart phones, personal digital assistants, location based services devices, digital cameras, music players, computers, routers, servers, and storage arrays, are packing more integrated circuits into an ever-shrinking physical space with expectations for decreasing cost. Both higher performance and lower power are also quintessential requirements for electronics to continue proliferation into everyday. For example, more functions are packed into a cellular phone with higher performance and longer battery life. Numerous technologies have been developed to meet these requirements.

Integrated circuits are often manufactured in and on silicon and other integrated multi-layer circuit wafers. Integrated circuits include literally millions of metal oxide semiconductor field effect transistors (MOSFET) and other active and passive circuit devices. Advances in integrated circuit technology continue to shrink the sizes of these devices and drive for higher performance with minimum power consumption. This dichotomy has inspired various approaches to solve the need for speed at lower power.

One approach involves continued shrinkage of key features of the integrated circuit technology while maintaining a high yield rate. This approach provides a size reduction but continues to struggle balancing cost, performance, and power.

Thus, a need remains for improving the yield, cost, and performance of the basic semiconductor structures and manufacturing to obtain maximum performance improvement, power reduction, or both. In view of the demand for faster and higher capacity semiconductor devices, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacturing an integrated circuit system including: providing a substrate; forming a polysilicon layer over the substrate; forming an anti-reflective coating layer over the polysilicon layer; etching an anti-reflective coating pattern into the anti-reflective coating layer leaving an anti-reflective coating residue over the polysilicon layer; and etching the anti-reflective coating residue with an etchant gas mixture comprising hydrogen bromide, chlorine, and oxygen to remove the anti-reflective coating residue for mitigating the formation of a polysilicon protrusion.

The present invention provides an integrated circuit system including: a substrate; a polysilicon layer over a portion of the substrate; an anti-reflective coating layer over the polysilicon layer; the anti-reflective coating layer having an anti-reflective coating residue; and the anti-reflective coating residue having the characteristic of a reduced level of the anti-reflective coating residue.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
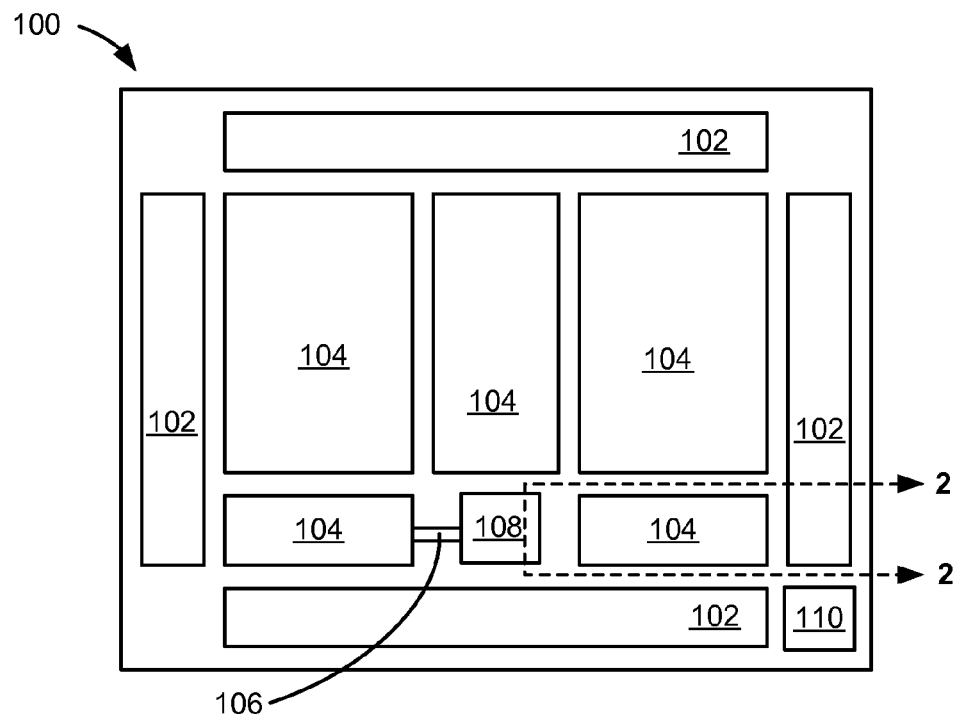
FIG. 1 is a top view of an integrated circuit system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. As a matter of descriptive convenience and are not intended to have any other significance or provide limitations for the present invention.

For expository purposes, the term "horizontal" as used herein is defined as a plane parallel to the plane or surface of the integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, stripping, implanting, doping, stressing, layering, and/or removal of the material or photoresist as required in forming a described structure.

Referring now to FIG. 1, therein is shown a top view of an integrated circuit system 100 in an embodiment of the present invention. The integrated circuit system 100 includes an external cell 102, such as an input/output (I/O) cell, a functional block 104, and an interconnect 106 connecting various elements of the integrated circuit system 100. The integrated circuit system 100 also includes an internal circuit element 108, such as a passive circuit element, and a peripheral circuit element 110, such as a passive circuit element. For illustrative purposes, the integrated circuit system 100 is shown having boundary or peripheral I/O ring, although it is understood that the integrated circuit system 100 may have a different configuration for the external cell 102, such as an array configuration for a land grid array.

System requirements often requires devices, such as the integrated circuit system 100, to interact with various system environments resulting in the integration of various circuit elements, such as circuits for analog or mixed-signal functions. The circuit elements for handling various system environments may reside in the peripheral region with the external cell 102, such as the peripheral circuit element 110. Other circuit elements, such as the internal circuit element 108, may reside within the core area of the integrated circuit system 100.

Figure 2:
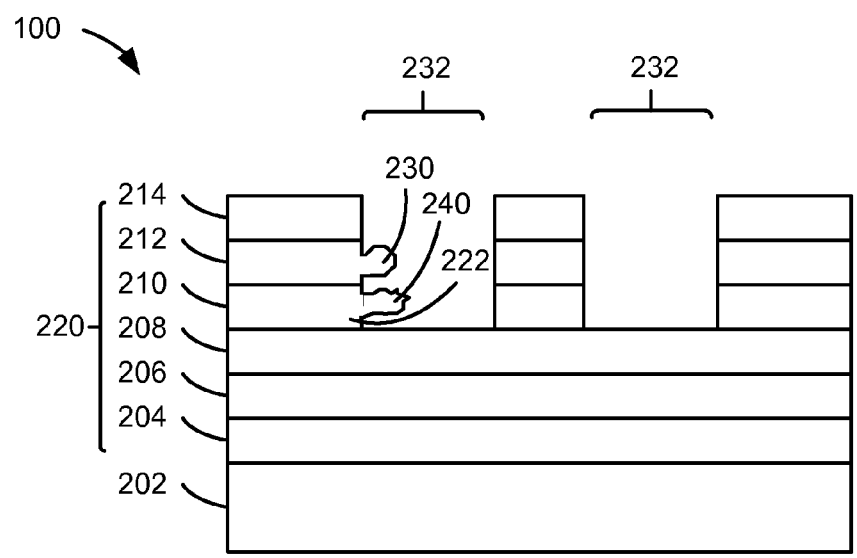
FIG. 2 is an example of a cross-sectional view of a portion of the integrated circuit system along a line 2-2 of FIG. 1.

Referring now to FIG. 2, therein is shown an example of a cross-sectional view of a portion of the integrated circuit system 100 along a line 2-2 of FIG. 1. The integrated circuit system 100 can include a substrate 202 and a layer stack 220 formed over a portion of the substrate 202. The substrate 202 is for base material for the integrated circuit system 100. The substrate 202 can include a p-type substrate wafer, a n-type substrate, a silicon-on-insulator, or a combination thereof.

The layer stack 220 is layers of semiconductor materials formed on the substrate 202 that is used to fabricate an element such as a transistor. For example, the layer stack 220 can include polycrystalline silicon (polysilicon) layers, optical planarizing layers, optical dispersive layers, dielectric layers, insulator layers, metal layers, conductor layers, photoresist layers, anti-reflective coating layers, or any combination thereof. Although the layer stack 220 is depicted as including multiple layers, it is understood that the layer stack 220 can have different configurations of layers that may include some, but not necessarily all, of the layers depicted in FIG. 2.

The layer stack 220 can include an insulator layer 204, such as silicon dioxide, formed over the substrate 202. The insulator layer 204 is for electrically isolating other layers on either side of the insulator layer 204. The insulator layer 204 can be comprised of a variety of materials including silicon dioxide, metal oxides, or a combination thereof.

The layer stack 220 can include a dielectric layer 206 formed over the insulator layer 204. The dielectric layer 206 is for electrically isolating layers on either side of the dielectric layer 206. The dielectric layer 206 can be comprised of a high k dielectric material, low k dielectric material, ultra-low k dielectric material, or a combination thereof. A high k material has a dielectric constant (k) that is greater than that of silicon dioxide, or above approximately 3.9.

The layer stack 220 can include a hardmask layer 208 formed over the dielectric layer 206. The hardmask layer 208 is used to preserve the patterning of smaller features than can be preserved using an organic etch mask. The hardmask layer 208 can be etched using a hardmask pattern to create an opening for a feature. For example, the hardmask layer 208 can be comprised of metal, spin on organic material, silicon oxide, silicon nitride, silicon carbide, tetraethyl orthosilicate (TEOS), silicon nitride carbide (SiCN), silicon oxynitride (SiON), amorphous silicon (a-Si), spin on glass (SOG), or a combination thereof.

The layer stack 220 can include a polysilicon layer 210 formed directly on the hardmask layer 208. The polysilicon layer 210 is for forming electrical elements in the integrated circuit system 100. The polysilicon layer 210 can be comprised of polycrystalline silicon, doped silicon, stressed silicon, or a combination thereof.

The layer stack 220 can include an anti-reflective coating layer 212 formed over the polysilicon layer 210. The anti-reflective coating layer 212 is used to minimize pattern distortion due to reflections. The anti-reflective coating layer 212 can include materials comprising silicon and nitrogen; silicon and oxygen; or silicon, oxygen and nitrogen, organic polymers, or a combination thereof.

The layer stack 220 can include a photoresist layer 214 formed over the anti-reflective coating layer 212. The photoresist layer 214 is used to protect layers in the direction of the anti-reflective coating layer 212 from being etched. The photoresist layer 214 can be comprised of organic photoresist materials, non-organic materials, or a combination thereof.

The layer stack 220 can be etched to produce an opening 232 and a circuit feature 222. The opening 232 is for separating the components on the sides of the opening 232. The circuit feature 222 can be a portion of an electrical component such as a line, a post, a transistor, a signal line, a ground line, an active component, a passive component, or a combination thereof.

During manufacturing, the integrated circuit system 100 including the substrate 202 and the layer stack 220 can undergo several manufacturing stages. These stages can include a cut mask hardmask open (CT-HMO) stage, an anti-reflective coating (ARC) open stage, an initial etch stage, a polysilicon etch stage, a clean stage, and an ARC residue etch stage.

During the cut mask hardmask open stage, portions of the layer stack 220 are etched to the level of the hardmask layer 208 according to a pattern provided by the hardmask mask. The cut mask hardmask open stage can include a strip process step where the hardmask layer 208 is etched with an etchant with a selectivity for the hardmask material of the hardmask layer 208.

Selectivity is a measure of the affinity of an etchant to a particular material. Selectivity is expressed as the ratio of the etching rate of the layer material to the etch rate of the non-selective material. For example, a gas mixture used for etching can have a selectivity of 20 for the anti-reflective coating residue 230 over that of polycrystalline silicon indicating it can consume 20 times more the anti-reflective coating residue 230 than for polycrystalline silicon.

During the initial etch stage, a mask pattern can be applied to the photoresist layer 214 and the layer stack 220 can be etched to remove portions of the photoresist layer 214, the anti-reflective coating layer 212, and the polysilicon layer 210. The initial etch stage can include a wet etch, dry etch, plasma etch, or any combination thereof.

During the anti-reflective coating open stage, the layer stack 220 can be etched to the level of the anti-reflective coating layer 212 using a variety of methods including wet etch, dry etch, plasma etching, reactive ion etching, or a combination thereof. Some etching processes are designed for a high selectivity to preserve mask material and pattern integrity in the interest of tip protection during the CT-HMO stage.

The etching of the anti-reflective coating layer 212 can create an anti-reflective coating residue 230. The anti-reflective coating residue 230 is a portion of the anti-reflective coating layer 212 that was incompletely removed during an etching step. The anti-reflective coating residue 230 can be comprised of Si-ARC material. The Si-ARC material is silicon containing anti-reflective organic material, which is used in the layer stack 220 to control the reflectivity of the layer stack 220.

During the polysilicon etch stage, the layer stack 220 can be etched partially into the polysilicon layer 210. The layer stack 220 can be etched in a variety of methods including a wet etch, dry etch, plasma etching, reactive ion etching, or a combination thereof.

The anti-reflective coating residue 230 remaining over the polysilicon layer 210 can block the etching process and result in the formation a polysilicon protrusion 240 in the polysilicon layer 210. The polysilicon protrusion 240 is a polysilicon residue that remains after etching the polysilicon layer 210. The polysilicon protrusion 240 can extend outward from the circuit feature 222, such as a poly line. The polysilicon protrusion 240 can be comprised of an amorphous silicon (a-Si) material, polycrystalline silicon, or a combination thereof.

The polysilicon protrusion 240 can be located at the inner sides of densely parallel polycrystalline silicon features, such as in high density static random access memory (SRAM) areas. The polysilicon protrusion 240 can cause the polycrystalline lines (PC) and contacts (CA) to come into direct electrical contact and create an electrical short circuit (PC-CA). The polysilicon protrusion 240 can cause PC-CA short circuit resulting in a decrease SRAM yield during production.

During the clean stage, the layer stack 220 can be processed to remove residual material from previous manufacturing stages. For example, the layer stack 220 can be cleaned with a wet clean process to remove residue including polysilicon, hardmask material, photoresist material, dielectric material, or a combination thereof.

During the ARC residue etch stage, the anti-reflective coating residue 230 can be etched to prevent the formation of the polysilicon protrusion 240. The anti-reflective coating residue 230 can be etched with a material with a selectivity for anti-reflective coating materials. Where the anti-reflective coating residue 230 is not present, the polysilicon layer 210 can be etched to create the circuit feature 222 without the polysilicon protrusion 240.

Etch processes are designed to have a high selectivity for the target etch material and to preserve mask material for pattern integrity for tip protection during the cut mask hard mask open process (CT HMO). Tip protection is the protection of the tips of circuit elements created by the etching process.

Existing etch processes can cause residue issues, including the creation of Si-ARC residue, during the etch process. However, low selectivity etch processes, such as Fluorine (F)-based etchants, can remove Si-ARC residue, but the etching process results in large tip-to-tip distance and large lateral etch bias.

The formation of the polysilicon protrusion 240 can occur in semiconductor fabrication processes with thin hardmask patterning solutions, such as Develop-Etch-Develop-Etch (DEDE), double patterning, or double exposure. The formation of the polysilicon protrusion 240 is observed less with softmask DEDE due to resist consumption.

The formation of the polysilicon protrusion 240 is not apparent in Silicon-on-Insulator DEDE processes due to thicker hardmask stack layers. The formation of the polysilicon protrusion 240 is not apparent with softmask applications, including non-metal gate applications.

The formation of the polysilicon protrusion 240 can be observed with thin hardmask layers. For example, the polysilicon protrusion 240 can be observed in bulk, rather than high performance layers. The formation of the polysilicon protrusion 240 can be dependent on resist material, thickness, and selectivity.

The formation rate of the polysilicon protrusion 240 can be reduced by running lower selectivity organic etch to consume the anti-reflective coating residue 230 with a unique halogen-rich non-SO2 chemistry. The halogen-rich non-SO2 chemistry is the gas mixture used to etch the anti-reflective coating residue 230. Removing the anti-reflective coating residue 230 mitigates the formation of the polysilicon protrusion 240 by preventing the anti-reflective coating residue 230 from blocking a future etching process of the polysilicon layer 210.

By removing the anti-reflective coating residue 230, tip-to-tip distance between other polysilicon features of the integrated circuit system 100 can be maintained because the etch is selective toward anti-reflective coating materials instead of polysilicon. The tip-to-tip distance is the distance between two polysilicon features of the integrated circuit system 100. For example, the tip-to-tip distance can be the distance between the tips of two adjacent polysilicon lines.

Error level measurement indicates that the level of defects, including weighted total defect density (WTDD) and random defect density (RDD), after running the organic transfer etch can be approximately 7% of the rate for a 14-fold improvement. For example, the error level for the level of defects can be reduced from a count of 2.8 per wafer to a count of 0.197 per wafer after running the organic transfer etch.

Figure 3:
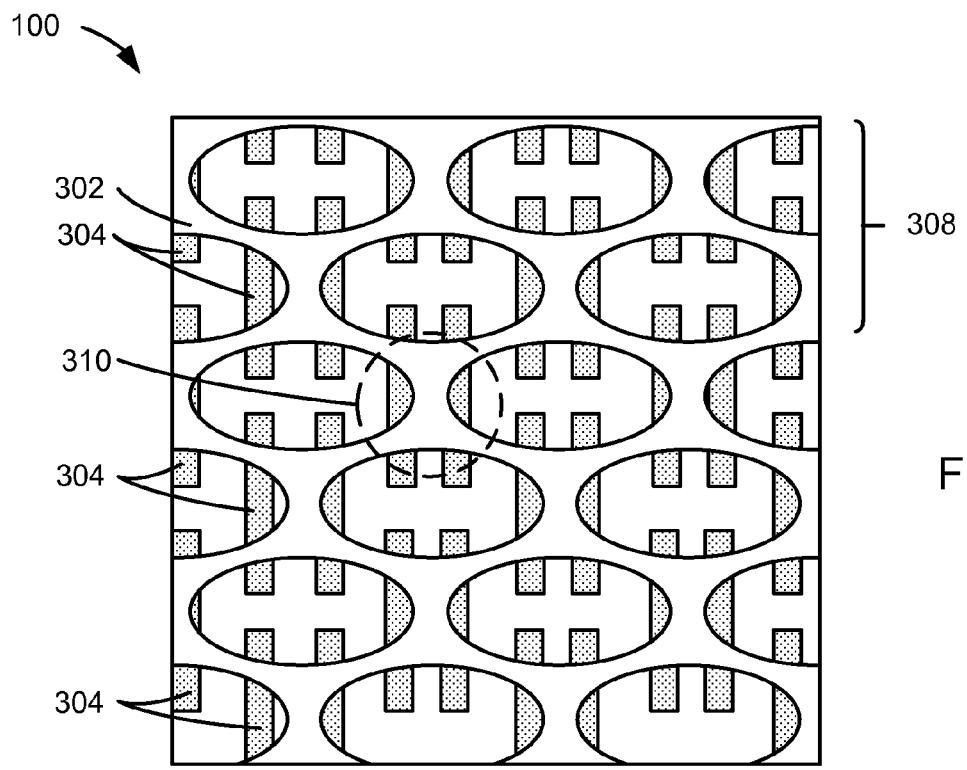
FIG. 3 is a detailed top view of a portion the integrated circuit system in a first manufacturing phase.

Referring now to FIG. 3, therein is shown a detailed top view of the integrated circuit system 100 in a first manufacturing stage. The integrated circuit system 100 is depicted after the cut mask hard mask open stage.

The integrated circuit system 100 can include an anti-reflective coating network 302 and a poly line 304. The anti-reflective coating network 302 is the remainder of the anti-reflective coating layer 212 of FIG. 2 left behind after the cut mask hard mask stage after mask openings have been etched in the anti-reflective coating layer 212. The anti-reflective coating network 302 is over the poly line 304. The first location 310 depicts an area on the anti-reflective coating network 302 over the poly line 304.

The etching of the anti-reflective coating layer 212 with an anti-reflective coating pattern 308 can result in leaving the anti-reflective coating network 302 over the polysilicon layer 210. The anti-reflective coating pattern 308 indicates the pattern of openings that should be etched in the anti-reflective coating layer 212 to create a portion of the integrated circuit system 100.

The poly line 304 is a polysilicon feature created by etching the layer stack 220. The integrated circuit system 100 can include one or more poly lines. For example, in a high density SRAM integrated circuit system, the poly lines can form a dense network.

Figure 4:
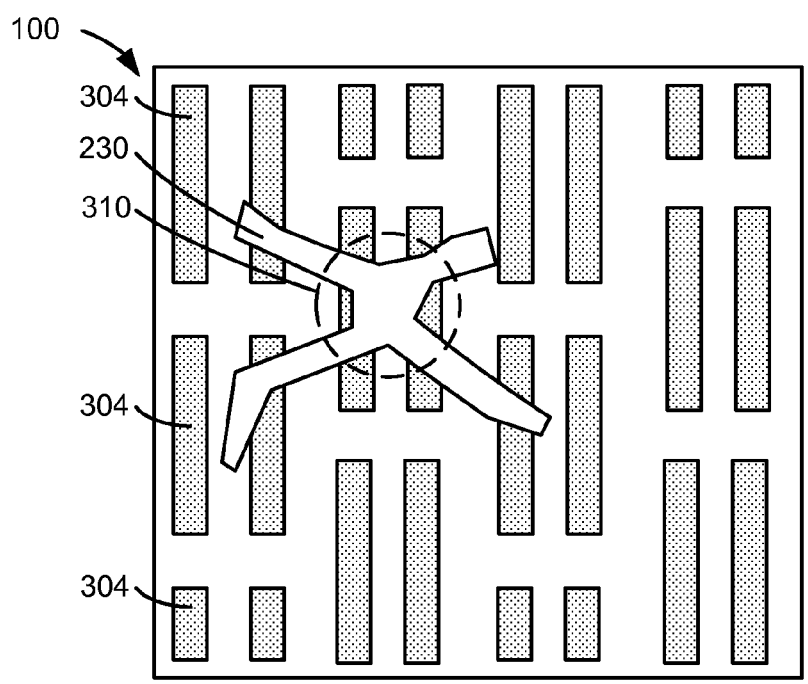
FIG. 4 is a detailed top view of the integrated circuit system in a second manufacturing phase.

Referring now to FIG. 4, therein is show a detailed top view of the integrated circuit system 100 in a second manufacturing stage. The integrated circuit system 100 is depicted after the anti-reflective coating open stage. During the anti-reflective coating open stage, the anti-reflective coating layer 212 is etched from the integrated circuit system 100.

The integrated circuit system 100 can include the poly line 304 and the anti-reflective coating residue 230, such as a Si-ARC network residue. The anti-reflective coating residue 230 is comprised of Si-ARC material from the anti-reflective coating layer 212 of FIG. 2 that was not completely etched away in the anti-reflective coating open stage.

The first location 310 shows a corresponding location in FIG. 3 and FIG. 4. The first location 310 depicts a location where the anti-reflective coating residue 230 can be formed over the poly line 304.

Where the anti-reflective coating residue 230 is present, the anti-reflective coating residue 230 can block further etching processes, such as the a-SI etch during the final stack etch. Blocking the polysilicon etch process can cause the incomplete etching of the polysilicon layer 210 resulting in the formation of the polysilicon protrusion 240 of FIG. 2. The formation of the polysilicon protrusion 240 can cause PC-CA short circuits.

It has been discovered that the present invention provides the integrated circuit system 100 that improves yield. The likelihood of the formation of the polysilicon protrusion 240 can be reduced by removing the anti-reflective coating residue 230 from the layer stack 220 of FIG. 2. Removing the anti-reflective coating residue 230 from the layer stack 220 can prevent the anti-reflective coating residue 230 from blocking the etching of the polysilicon layer 210 that can result in the creation of the polysilicon protrusion 240. The reduction in the number of the polysilicon protrusion 240 can reduce the number of or eliminate PC-CA short circuits and increase the yield of the integrated circuit system 100.

Figure 5:
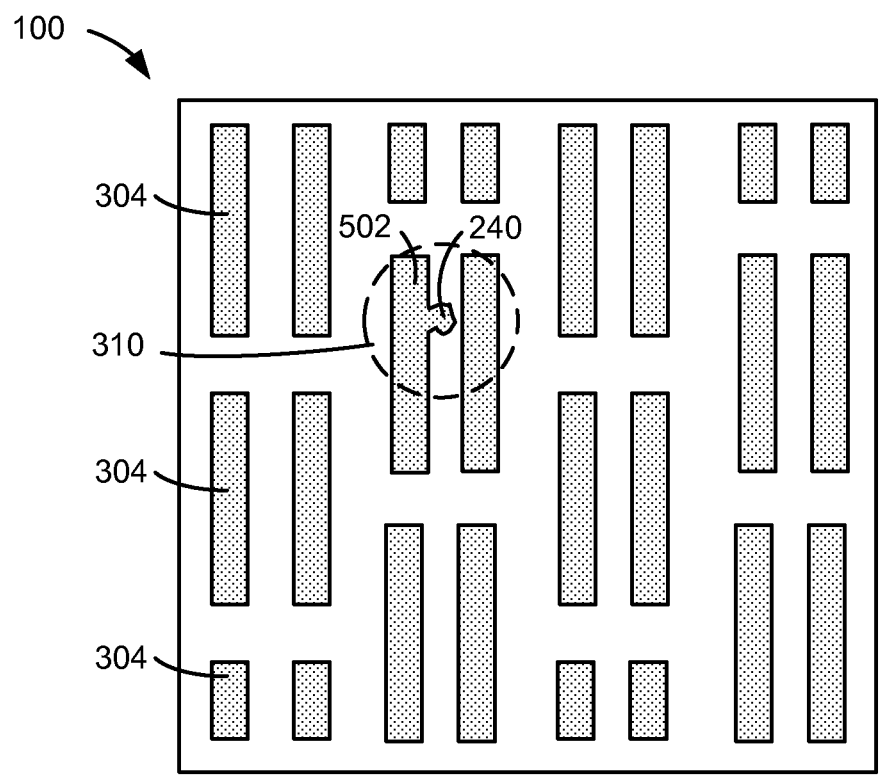
FIG. 5 is a detailed top view of the integrated circuit system in a third manufacturing phase.

Referring now to FIG. 5, therein is show a detailed top view of the integrated circuit system 100 in a third manufacturing stage. The integrated circuit system 100 is depicted after the clean stage.

The integrated circuit system 100 depicts the poly line 304, a protrusion line 502, and the polysilicon protrusion 240. The protrusion line 502 is connected to the polysilicon protrusion 240.

The first location 310 shows the corresponding location in FIG. 3 and FIG. 4. The first location 310 depicts a location where the polysilicon protrusion 240 can be formed.

The polysilicon protrusion 240 can be formed where the anti-reflective coating residue 230 of FIG. 4 blocks a portion of the etching of the polysilicon layer 210. The portion of the polysilicon layer 210 that is not completely etched can form the polysilicon protrusion 240.

Figure 6:
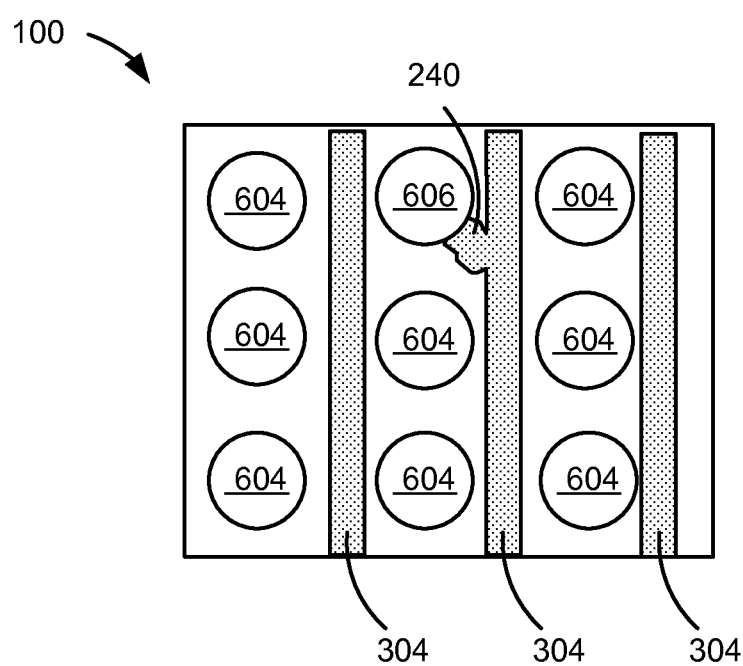
FIG. 6 is a top view of another portion of the integrated circuit system.

Referring now to FIG. 6, therein is shown a top view of another portion of the integrated circuit system 100. The integrated circuit system 100 can include the poly line 304, a post element 604, a shorted post 606, and the polysilicon protrusion 240.

The poly line 304 is a non-insulating feature formed over the substrate 202 of FIG. 2. The poly line 304 can be a variety of elements including an active component, a passive component, a signal line, a ground line, a power line, or a combination thereof.

The post element 604 is a circuit feature formed over the substrate 202. The post element 604 can be a quantum dot, an active component, a passive component, or a combination thereof.

The shorted post 606 is a circuit feature formed over the substrate 202. The shorted post 606 can be in contact with the polysilicon protrusion 240 resulting in a short circuit.

The polysilicon protrusion 240 is a residue from an etch process of the polysilicon layer 210 of FIG. 2 that can extended from the poly line 304 to the shorted post 606. The polysilicon protrusion 240 can be comprised of amorphous silicon, anti-reflective coating residue, polycrystalline silicon reside, or any combination thereof. The PC-CA short circuit can include a short circuit between two poly lines, between a post and a poly line, between two circuit features, or a combination thereof.

Figure 7:
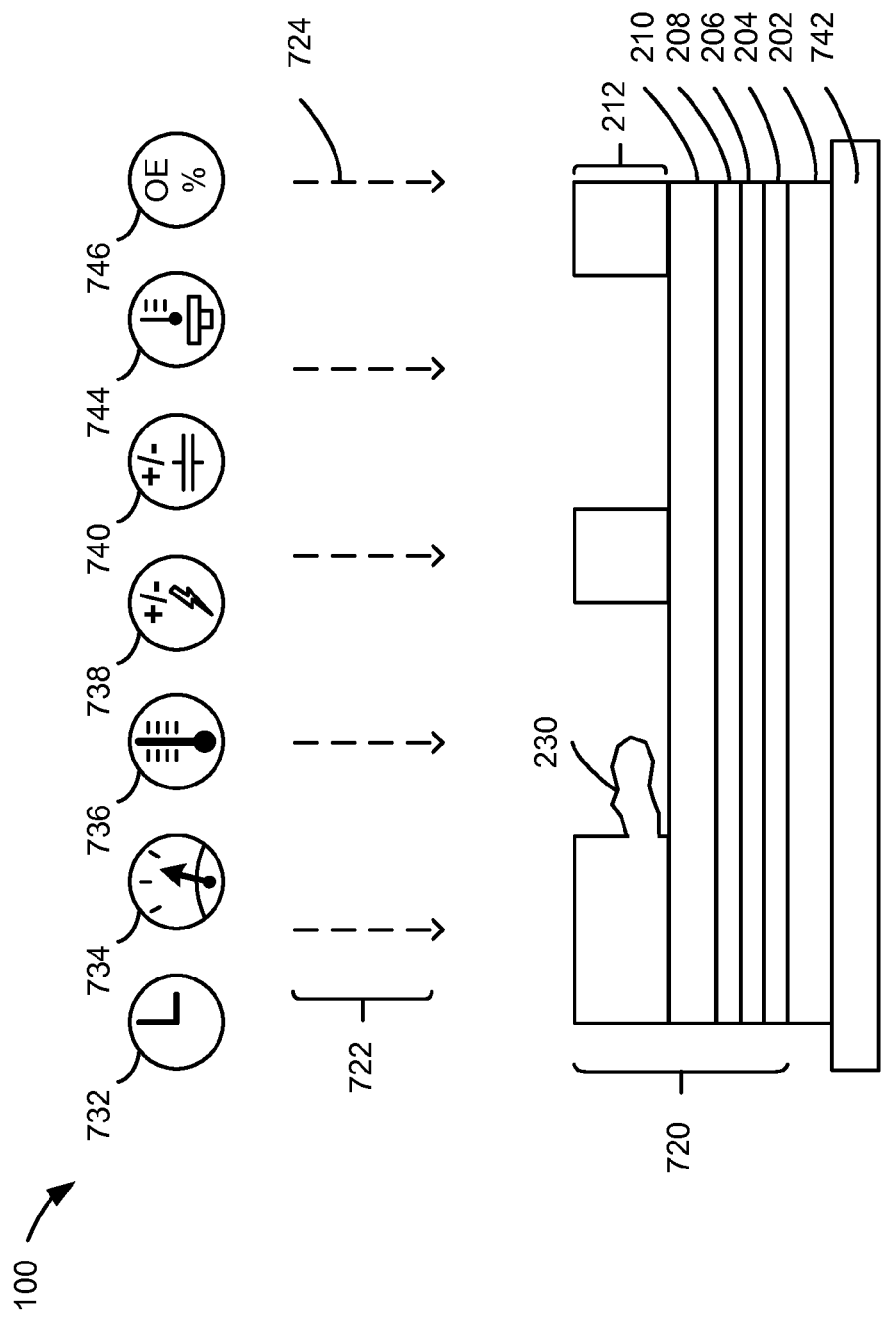
FIG. 7 is a cross-sectional view of the integrated circuit system in a fourth manufacturing phase.

Referring now to FIG. 7, therein is shown a cross-sectional view of the integrated circuit system 100 in a fourth manufacturing stage. The integrated circuit system 100 is depicted in the anti-reflective coating etch stage. The integrated circuit system 100 can include the substrate 202 and a layer stack 720.

The integrated circuit system 100 can include the insulator layer 204 formed over the substrate 202. The integrated circuit system 100 can include the dielectric layer 206 formed over the insulator layer 204. The integrated circuit system 100 can include the hardmask layer 208 formed over the dielectric layer 206. The integrated circuit system 100 can include the polysilicon layer 210 formed over the hardmask layer 208. The integrated circuit system 100 can include the anti-reflective coating residue 230.

The anti-reflective coating residue 230 is a portion of the anti-reflective coating layer 212 of FIG. 2. The anti-reflective coating residue 230 can be created by an incomplete etching of the anti-reflective coating layer 212. Removing the anti-reflective coating residue 230 can mitigate the formation of the polysilicon protrusion 240 of FIG. 2.

The integrated circuit system 100 has the physical characteristic of the anti-reflective coating residue 230 being etched where the polysilicon protrusion 240 has been eliminated or the PC-CA short typically caused by the polysilicon protrusion has be eliminated or reduced. The integrated circuit system 100 has the physical characteristic of the anti-reflective coating layer 212 having a reduction of the level of the anti-reflective coating residue 230.

In a manufacturing example, the integrated circuit system 100, including the substrate 202, the layer stack 720, and the anti-reflective coating residue 230, can be placed into a processing chamber (not shown) for processing. The processing chamber can include a cathode pedestal 742. The cathode pedestal 742 is for holding the substrate 202 in the processing chamber. The substrate 202 can be part of a p-type wafer.

The processing chamber is for providing a controlled environment for the processing of semiconductor materials. The processing chamber can be a device such as a vacuum chamber, an inductively coupled plasma reactor, an etch reactor, a remote source plasma reactor, an electron-cyclotron resonance reactor, or a combination thereof.

The processing chamber can create a controlled environment for processing by providing control over a processing pressure 734, an etchant gas mixture 724, a gas flow, a plasma temperature 736, a cathode temperature 744, a source power 738, a bias power 740, an exposure time 732, and an overetch percentage 746. The processing chamber can have a variety of configurations.

The etchant gas mixture 724 is the gas mixture used to etch the anti-reflective coating layer 212. The etchant gas mixture 724 can comprise an organic transfer etchant gas mixture, hydrogen bromide, chlorine, oxygen, or a combination thereof.

The processing pressure 734 is the pressure of the gas mixture within the processing chamber. The exposure time 732 is the amount of time the substrate 202 is processed in the processing chamber. The cathode temperature 744 is the temperature of the cathode pedestal 742 where the substrate 202 is mounted.

The processing chamber can control the plasma temperature 736 by applying the source power 738 in the chamber.

The processing chamber can also control the electrical charge on the substrate 202 by applying the bias power 740 to the substrate 202 mounted on the cathode pedestal 742 within the processing chamber.

Increasing the source power 738 and the bias power 740 can increase the etch rate and increase the removal of the anti-reflective coating residue 230. Increasing the source power 738 and the bias power 740 can increase lateral etch bias and cause tip-to-tip distance loss. The tip-to-tip distance is the distance between circuit elements created on the layer stack 720, such as a static random access memory (SRAM) cell.

The substrate 202 and the layer stack 720 can be exposed to an organic transfer etch 722 in the processing chamber to remove the anti-reflective coating residue 230. The organic transfer etch 722 is a plasma created by heating the etchant gas mixture 724 in the processing chamber. The etchant gas mixture 724 can be heated using resistive heating elements, radio-frequency (RF) heating, heat lamps, or a combination thereof.

For example, the etchant gas mixture 724 can be heated with the source power 738 set to a range of between approximately 50 to 1500 watts. The substrate 202 attached to the cathode pedestal 742 can have the bias power 740 of between approximately 10 and approximately 150 watts.

The organic transfer etch 722 can be conducted in a variety of methods. For example, the organic transfer etch 722 can be conducted where the etchant gas mixture 724 is a non-SO2 based chemistry that can include hydrogen bromide (HBr). The etchant gas mixture 724 can include a flow of chlorine (Cl2) in the range of approximately 5 to approximately 200 standard cubic centimeters per minute (sccm). The etchant gas mixture 724 can include a flow of oxygen (O2) in the range of approximately 5 to approximately 100 sccm.

Increasing the flow of chlorine can remove more of the anti-reflective coating residue 230 while preserving the tip-to-tip distance. The flow of chlorine can be balanced in combination with the other etchant gases can create sufficient passivation on etched surfaces. Passivation is the creation of a non-reactive layer, such as a oxide layer, on a semiconductor surface. However, higher levels of the flow of chlorine can reduce the selectivity to tetraethyl orthosilicate (TEOS) and create punch through in the hardmask layer 208.

The organic transfer etch 722 can be conducted with the etchant gas mixture 724 at the processing pressure 734 of approximately 3 to approximately 50 milliTorr (mTorr). The organic transfer etch 722 can be conducted with the cathode pedestal 742 at the cathode temperature 744 of between approximately 0 to approximately 100 degrees Celsius.

Increasing the processing pressure 734 can help preserve the tip-to-tip distance by generating additional polymer byproducts and increasing passivation. However, higher levels of the processing pressure 734 can create additional lateral etching and increase tip-to-tip distance loss. Balancing the processing pressure 734, the source power 738 and the bias power 740 can help create sufficient passivation and still maintain the selectivity at a level to avoid punch-through of the hardmask layer 208.

Lowering the cathode temperature 744 can increase the level of passivation during the etch process and help preserve the tip-to-tip distance. For example, lowering the cathode temperature 744 to increase the level of passivation can help shrink the tip-to-tip distance for a SRAM cell.

The organic transfer etch 722 can be conducted with the overetch percentage 746 of 5% to 50% with the same main etch chemistry or a higher selectivity chemistry. Overetch is where the etching process has continued beyond a pre-defined level. The overetch process can increase the amount of material etched to remove parts of the hardmask layer 208. The overetch percentage 746 can be balanced to remove excess organic residue, but not cause tip-to-tip distance loss or cause punch though in the hardmask layer 208.

The overetch percentage 746 is the degree of overetching expressed as a percentage. The overetch percentage 746 can include extending the etching process for a longer period than has been pre-defined. The overetch percentage 746 can include etching a material with a higher concentration of etchant than the pre-defined process would use.

In another example, the organic transfer etch 722 can include the etchant gas mixture 724 where the etchant gas mixture 724 can include a flow of chlorine (Cl2) in the range of approximately 10 to approximately 80 sccm. The etchant gas mixture 724 can include a flow of oxygen (O2) in the range of approximately 15 to approximately 50 sccm.

The organic transfer etch 722 can be conducted under a pressure of approximately 3 to approximately 20 mTorr with a source power of approximately 500 to approximately 700 watts and a bias power of approximately 20 to approximately 100 watts. The organic transfer etch 722 can be conducted with a cathode temperature range of approximately 0 to approximately 50 degrees Celsius inclusive.

The organic transfer etch 722 can be conducted with the overetch percentage 746 of approximately 5% to approximately 30% with the same main etch chemistry or a higher selectivity chemistry. Higher selectivity chemistries can be based on the optical planarizing layer main etch process.

For the overetch process, the selectivity to the hardmask material, including TEOS hardmask materials underneath an optical planarizing layer, is critical for proper etching and to prevent punch though in the hardmask layer 208. High selectivity to the hardmask material can be achieved by setting the flow of chlorine to the range of approximately 10 to approximately 60 sccm. Higher selectivity can also be achieved by increasing the processing pressure 734 or increasing the flow of oxygen in the range of approximately 20 to approximately 60 sccm.

It has been discovered that the present invention provides the integrated circuit system 100 that increases reliability. The etching the layer stack 220 using the organic transfer etch 722 with the etchant gas mixture 724 can reduce the size, number, and amount of the anti-reflective coating residue 230. The reduced number of the anti-reflective coating residue 230 can mitigate the formation of the polysilicon protrusion 240 of FIG. 2 in later processing stages. The reduced number of the polysilicon protrusion 240 can decrease the probability of defects caused by short circuits and increase the reliability of the integrated circuit system 100. The organic transfer etch 722 can increase the overall yield of the integrated circuit system 100.

It has further been discovered that the present invention provides the integrated circuit system 100 that reduces testing costs. The use of the etchant gas mixture 724 reduces the etching of titanium nitrate (TiN) in the integrated circuit system 100. The organic transfer etch 722 can remove the anti-reflective coating residue 230 and not remove layers containing titanium nitrate. The prevention of TiN erosion can reduce the amount of testing required during the manufacturing process.

It has yet further been discovered that the present invention provides the integrated circuit system 100 that increases yield and reduce defects. The balancing of the source power 738, the bias power 740, the chlorine flow, the oxygen flow, the processing pressure 734, the cathode temperature 744, and the overetch percentage 746 can control the etching environment and raise etch selectivity to increase passivation, reduce tip-to-tip loss, and prevent hardmask punch through.

Figure 8:
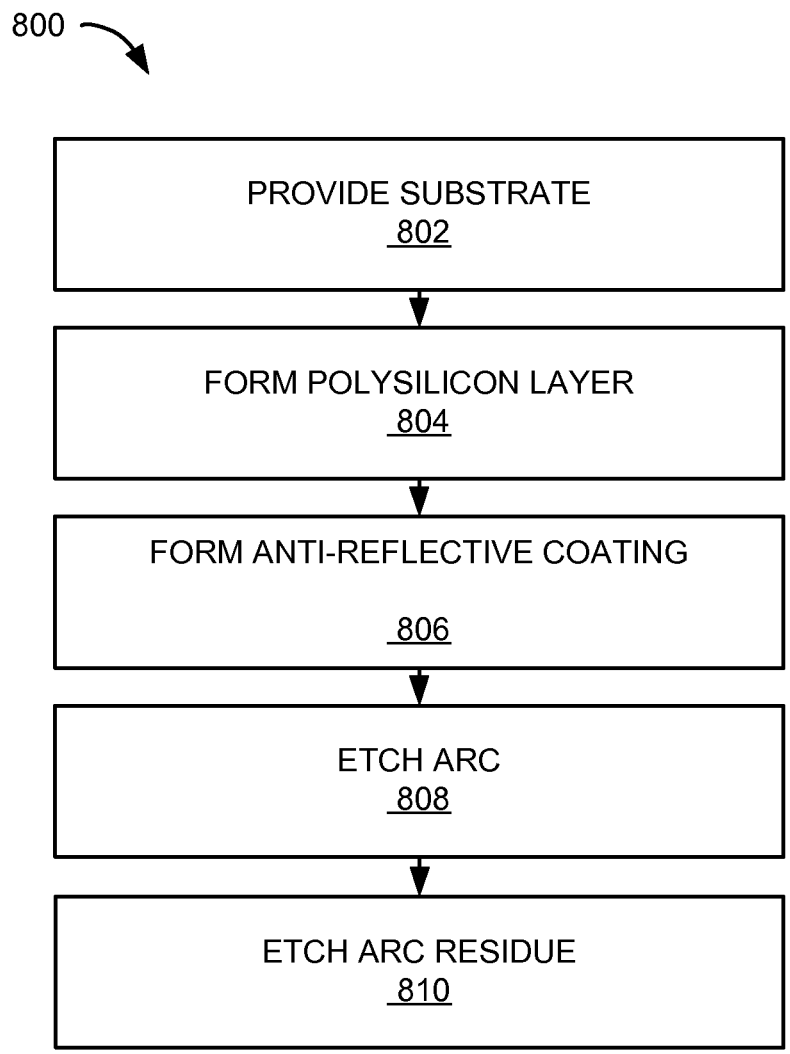
FIG. 8 is a flow chart of a method for manufacturing of the integrated circuit system in a further embodiment of the present invention.

Referring now to FIG. 8 therein is shown a flow chart of a method 800 for manufacture of the integrated circuit system 100 in a further embodiment of the present invention. The method 800 includes providing a substrate in a block 802, forming the polysilicon layer in a block 804, forming the anti-reflective coating layer in a block 806, etching the anti-reflective coating layer in a block 808, and etching an anti-reflective coating residue in a block 810.

It has been discovered that the present invention thus has numerous aspects.

It has also been discovered that the removal of the anti-reflective coating residue 230 of FIG. 7 from the integrated circuit system 100 can increase the yield of the integrated circuit system 100. The removal of the anti-reflective coating residue 230 can mitigate the formation of the polysilicon protrusion 240 and reduce the incidence of PC-CT short circuits in the integrated circuit system 100. The reduced incidence of PC-CT short circuits increases the productive yield of the integrated circuit system 100.

It has also been discovered that the formation of polysilicon protrusions is significantly reduced by running a lower selectivity organic transfer etch to consume Si-ARC residue with a halogen rich non-SO2 chemistry. Defects related to polysilicon protrusions can be reduced by as much as 14-fold, or down to 7% of previous polysilicon protrusion formation levels compared to situations without the organic transfer etch.

Another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system method and apparatus of the present invention furnish important and heretofore unknown and unavailable solutions, capabilities, and functional aspects for integrated circuit systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hitherto fore set forth herein or shown in the accompanying drawings are to be interpreted in an illustrative and non-limiting sense.

What is claimed is:

1. A method of manufacture of an integrated circuit system comprising:
   providing a substrate;
   forming a hardmask layer over the substrate;
   forming a polysilicon layer directly on the hardmask layer;
   forming an anti-reflective coating layer over the polysilicon layer;
   etching an anti-reflective coating pattern into the anti-reflective coating layer leaving an anti-reflective coating residue over the polysilicon layer; and
   etching the anti-reflective coating residue with an etchant gas mixture of hydrogen bromide, chlorine, and oxygen to remove the anti-reflective coating residue for mitigating the formation of a polysilicon protrusion.

2. The method as claimed in claim 1 wherein etching the anti-reflective coating residue with the etchant gas mixture includes flowing chlorine between approximately 5 and approximately 200 standard cubic centimeters per minute.

3. The method as claimed in claim 1 wherein etching the anti-reflective coating residue with the etchant gas mixture includes flowing chlorine between approximately 10 and approximately 60 standard cubic centimeters per minute.

4. The method as claimed in claim 1 etching the anti-reflective coating residue with the etchant gas mixture includes flowing oxygen between approximately 5 and approximately 100 standard cubic centimeters per minute.

5. The method as claimed in claim 1 etching the anti-reflective coating residue with the etchant gas mixture includes flowing oxygen between approximately 20 and approximately 60 standard cubic centimeters per minute.

6. The method as claimed in claim 1 wherein etching the anti-reflective coating residue includes the anti-reflective coating residue with a pressure of between approximately 3 to approximately 50 milliTorr.

7. The method as claimed in claim 1 wherein etching the anti-reflective coating residue includes etching the anti-reflective coating residue with a source power of approximately 50 to approximately 1500 watts and bias power of approximately 10 to approximately 150 watts.

8. The method as claimed in claim 1 wherein the anti-reflective coating residue includes etching the anti-reflective coating residue with a cathode temperature between approximately 0 and approximately 100 degrees Celsius.

9. The method as claimed in claim 1 wherein etching the anti-reflective coating residue includes etching the anti-reflective coating residue with an overetch percentage of between approximately 5% and approximately 50%.

10. A method of manufacture of an integrated circuit system comprising:
    providing a substrate;
    forming a hardmask layer over the substrate;
    forming a polysilicon layer directly on the hardmask layer;
    forming an anti-reflective coating layer over the polysilicon layer;
    etching an anti-reflective coating pattern into the anti-reflective coating layer leaving an anti-reflective coating residue over the polysilicon layer;
    etching the anti-reflective coating residue with an etchant gas mixture of hydrogen bromide, chlorine, and oxygen to remove the anti-reflective coating residue for mitigating the formation rate of a polysilicon protrusion; and
    etching the polysilicon layer forming a circuit feature without the polysilicon protrusion.

11. The method as claimed in claim 10 wherein etching the anti-reflective coating residue with the etchant gas mixture includes flowing chlorine between approximately 10 and approximately 80 standard cubic centimeters per minute.

12. The method as claimed in claim 10 wherein:
    etching the anti-reflective coating residue with the etchant gas mixture with a higher selectivity includes flowing chlorine between approximately 10 and approximately 80 standard cubic centimeters per minute or flowing oxygen between approximately 20 and approximately 60 standard cubic centimeters per minute.

13. The method as claimed in claim 10 wherein etching the anti-reflective coating residue with the etchant gas mixture includes flowing oxygen between approximately 15 and approximately 50 standard cubic centimeters per minute.

14. The method as claimed in claim 10 wherein etching the anti-reflective coating residue includes etching the anti-reflective coating residue with a pressure of between approximately 3 to approximately 20 milliTorr.

15. The method as claimed in claim 10 wherein etching the anti-reflective coating residue includes etching the anti-reflective coating residue with a source power of approximately 50 to approximately 700 watts.

16. The method as claimed in claim 10 wherein etching the anti-reflective coating residue includes etching the anti-reflective coating residue with a bias power of approximately 20 to approximately 100 watts.

17. The method as claimed in claim 10 wherein etching the anti-reflective coating residue includes etching the anti-reflective coating residue with a cathode temperature of between approximately 0 and approximately 50 degrees Celsius.

18. The method as claimed in claim 10 wherein etching the anti-reflective coating residue includes etching the anti-reflective coating residue using an overetch percentage of between approximately 5% and approximately 30%.

19. An integrated circuit system comprising:
a substrate;
a hardmask layer over the substrate;
a polysilicon layer directly on the hardmask layer;
an anti-reflective coating layer over the polysilicon layer;
the anti-reflective coating layer having an anti-reflective coating pattern and an anti-reflective coating residue; and
the anti-reflective coating residue having the characteristic of a reduced level of the anti-reflective coating residue.

20. The system as claimed in claim 19 wherein:
the polysilicon layer having the characteristic of a reduced level of formation of the polysilicon protrusion.

* * * * *